(12) United States Patent
Lapadatu et al.

(10) Patent No.: US 6,684,699 B1
(45) Date of Patent: Feb. 3, 2004

(54) MICROMECHANICAL DEVICE

(75) Inventors: Daniel Lapadatu, Horten (NO); Terju Kvisteroy, Horten (NO); Henrik Jakobsen, Horten (NO)

(73) Assignee: Sensonor asa, Horten (NO)

( * ) Notice: Subject to any disclaimer, the term of this patent is extended or adjusted under 35 U.S.C. 154(b) by 210 days.

(21) Appl. No.: 09/660,676

(22) Filed: Sep. 13, 2000

(30) Foreign Application Priority Data

Oct. 29, 1999  (EP) ............................................. 99308589

(51) Int. Cl.[7] ................................................ G01P 15/10
(52) U.S. Cl. .................................. 73/514.29; 73/DIG. 1
(58) Field of Search ........................ 73/514.35, 514.01, 73/514.16, 514.15, 514.21, 514.24, 514.29, 514.32, 514.33, 514.36, 514.38, 504.04, 504.12, 862.382, 862.474, DIG. 1

(56) References Cited

U.S. PATENT DOCUMENTS

| | | | | |
|---|---|---|---|---|
| 4,945,765 A | * | 8/1990 | Roszhart | 73/DIG. 1 |
| 5,594,172 A | * | 1/1997 | Shinohara | 73/514.33 |
| 5,643,803 A | * | 7/1997 | Fukada et al. | 437/15 |
| 5,830,777 A | * | 11/1998 | Ishida et al. | 438/50 |
| 6,153,917 A | * | 11/2000 | Matsunaga et al. | 257/419 |

* cited by examiner

Primary Examiner—Helen Kwok
(74) Attorney, Agent, or Firm—Boyle, Fredrickson, Newholm, Stein & Gratz, S.C.

(57) ABSTRACT

A pedestal structure and its fabrication method stress release assembly of micromechanical sensors, in particular acceleration sensor, angular rate sensors, inclination sensors or angular acceleration. At least one silicon seismic mass is used as sensing element. The at least one silicon seismic mass is joined to the silicon frame via at least one assembly pedestal, the surface of which is bonded to a covering wafer, either glass or silicon.

18 Claims, 7 Drawing Sheets

MICROMECHANICAL DEVICE

BACKGROUND AND SUMMARY

The invention relates to a micromechanical device, such as an acceleration sensor, angular rate sensor, inclination sensor, or angular acceleration sensor, in which a seismic mass is used as sensing element.

Many devices having micromechanical structures are currently known. One problem associated with many of such structures is that manufacture of the devices introduces internal stresses in the structure and participating in the components which measure the parameter to which the sensor is sensitive. Generation of such stresses causes problems. It often results in the sensor having an offset or varying unpredictably with temperature or over the sensing range of the sensor. This results in each sensor requiring individual testing and appropriate means, either via mechanical or electrical compensation, to be provided in order for the sensor to operate accurately and consistently. It will be appreciated that this can cause a considerable increase in sensor cost, as well as reducing reliability.

Many attempts have been made to overcome the problem associated with induced stress. Most of the approaches are, however, dependent upon employing very specific materials, either in the device components or in the encasing packaging of the device, meaning that are inflexible and cannot be broadly applied to different device types. Many have an additional problem they in requiring extremely complex and costly manufacturing steps which again increase cost and which can be time consuming and result in many rejected devices.

According to the present invention there is provided A micromechanical device comprising:

a pedestal member connected, in use, to a support wall and bonded, in use, to an encasing member; and wherein the pedestal member has a rim formed around at least a portion of its outer periphery, the rim extending away from the encasing member and supporting at least one sensing component of the device; and wherein the pedestal member is elongate, with its longer dimension extending in a direction substantially perpendicular to that of the support wall to which it connects.

The device may comprise the support wall which may be arranged such that it surrounds both the pedestal member and the component.

The pedestal member may be bonded to the encasing member in a discontinuous manner.

The component may be connected to the pedestal member by one or more planar flexible hinges.

The micromechanical device may be an acceleration sensor, an angular rate sensor, an inclination sensor, or an angular acceleration sensor.

A gap between the component and the encasing member may be provided and may be formed by an etched recess in the encasing member.

Electrical contacts may be provided with the component or suspension member by the provision of direct electrical contacts located on the edge of the pedestal and on the contact surface of the encasing member. Alternatively, electrical conductors may be provided by implantation of impurities or by sputter deposition of film onto the pedestal structure.

Electrical crossings may be provided perpendicular to the direction of elongation of the pedestal member in order to further reduce stresses in the overall device structure. The device may be formed from silicon.

A method of manufacturing the device is also provided. Within this invention, at least one silicon seismic mass may be joined to a silicon support wall frame via the pedestal structure, the surface of which is bonded to the encasing member which is, either glass or silicon.

This pedestal structure and its method of assembly according to the invention has the advantage that the coupling between the sensing element of the sensor and the frame of the sensor is minimised by using the pedestal member, the bearing surfaces of which are small compared to the surface area from which the device is formed. This reduces the assembly-related strains, stress and associated temperature-induced variations of the overall device, thus simplifying the evaluation electronics of the device.

Other provisions of the structure and its method of assembly according to the invention are also advantageous.

The pedestal member can be fabricated easily, being produced in the same process that structures the micromechanical components of the device, such as a sensing seismic elements and their suspension systems. This structuring process is especially advantageous because well known and established micromechanical structuring processes, such as wet and dry anisotropic silicon etching, can be used for this purpose.

A particular advantage of the pedestal member and its assembly method according to the invention is that the geometry and the manner of its structuring can be selected in accordance with the function of the sensing element and its fabrication sequence.

A special advantage of this invention is that any bonding between the covering wafers and the micromachined silicon wafer, which caries the component, the pedestal member and the support wall, takes place at the wafer level, resulting in economical, easy to handle batch processing. According to the invention, a multitude of ready-structured devices, which have not yet been cut in individual devices, can be bonded simultaneously to the encasing member, then separated, for instance by sawing.

The bonding technique that forms any sealed cavity and anchors the pedestal member to the encasing member is to be chosen depending on the material of the encasing member. If glass is used for covering, then an anodic bonding technique is suitable; if silicon is used, then silicon-to-silicon bonding techniques are advantageously suited. For other materials, soldering bonding techniques can be successfully employed. The atmosphere composition and its pressure can be freely selected and preserved within any sealed cavity by the anodic bonding technique, which makes this technique particularly attractive.

The device and its method of assembly according to the invention allows the optional implementation in its structure of (i) press-contacts, a method of passing electrical conductive paths between the wafers; (ii) buried crossings, a method of passing electrical conductive paths through the bulk of pedestal; (iii) direct crossings, a method of passing electrical conductive paths across the pedestal; and (iv) surface conductors along the pedestal.

The invention particularly enables the realisation of a compact sensor as no other stress-releasing structures or mounting techniques, internal or external, being required.

BRIEF DESCRIPTION OF THE DRAWINGS

The pedestal structure and its method of assembly according to the present invention will now be described, with reference to the accompanying drawings, in which.

DETAILED DESCRIPTION

Figure 1:
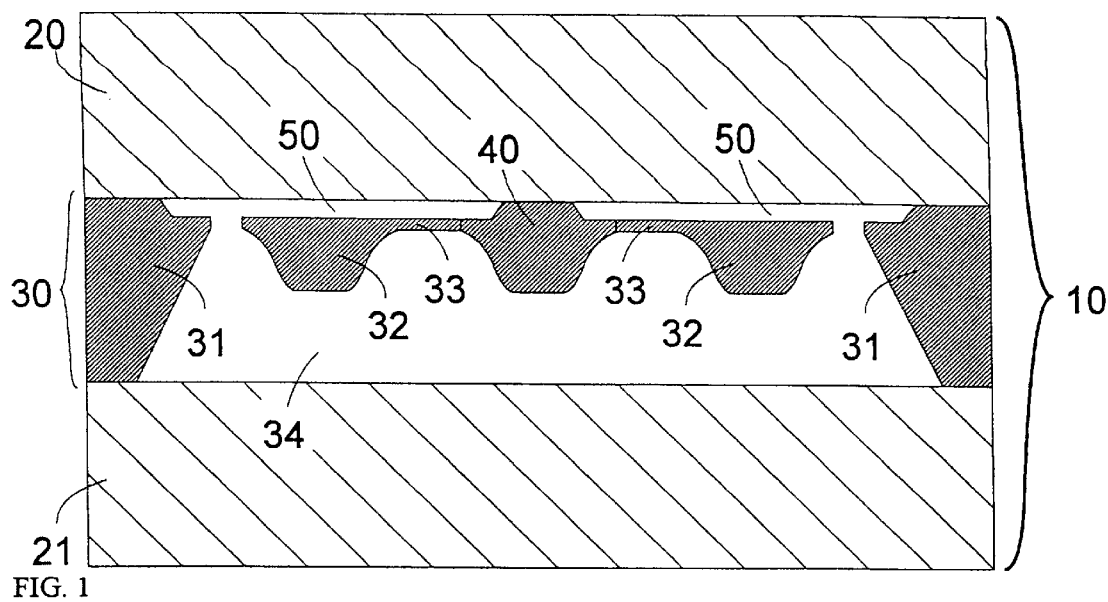
FIG. 1 is a section through a sensor device according to the invention having its sensing components joined to its frame by means of a pedestal member.
Figure 2:
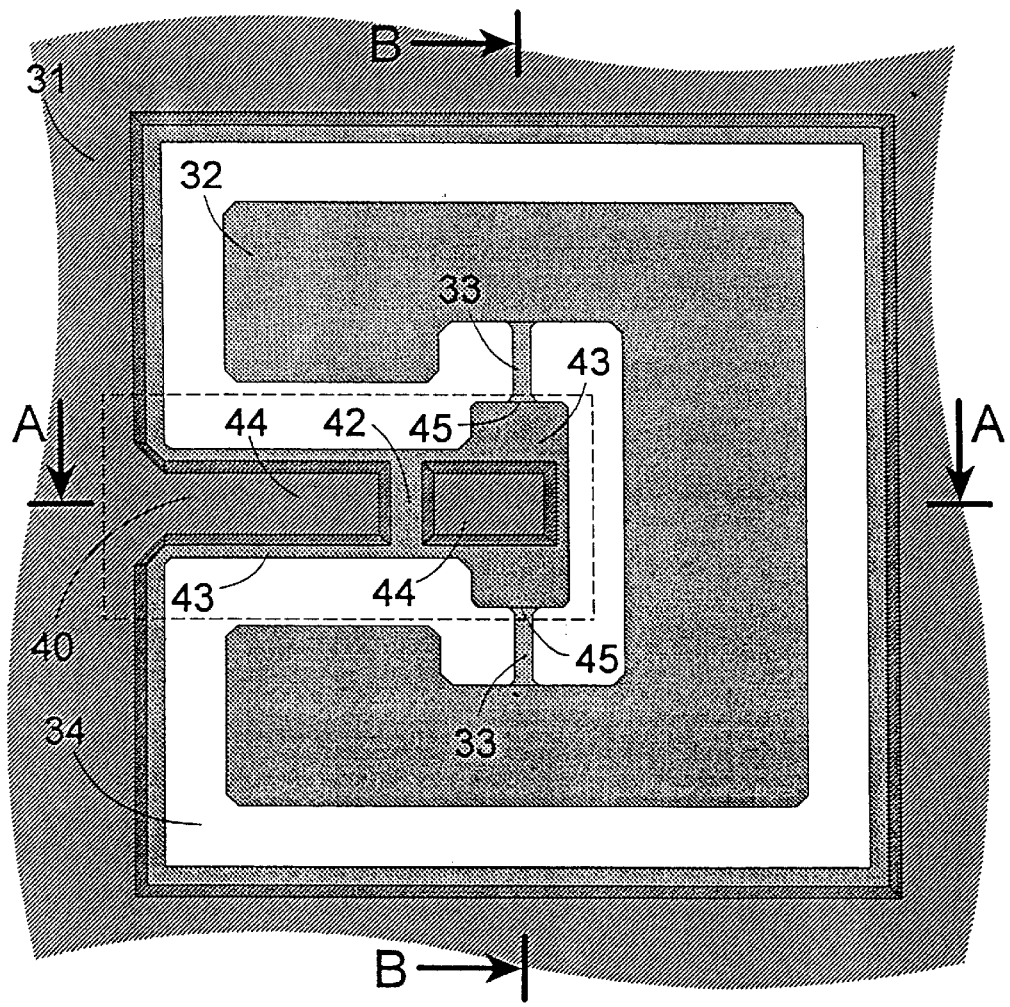
FIG. 2 is a top view of a sensing component attached to the frame by means of a pedestal member structure.

FIG. 1 shows a cross-sectional view of an inertial sensor device 10 in accordance with the present invention. The inertial sensor 10 is realised by bonding a structured silicon wafer 30 between two encasing member 20 and 21, which can be structured or not, and which can be glass or silicon, depending on the sensor function and operating principle. FIG. 2 shows an exemplary top view of an inertial sensor according to the present invention.

The substrate wafer 30 contains at least one silicon seismic mass 32 which acts as the sensor's primary sensing component, attached to a fixed silicon frame 31 by means of at least one flexible suspension system 33 and a rigid pedestal member 40. The suspension systems are indicated in the figures as double clamped straight beams, but they may have any arbitrary planar shape.

With this configuration, an impressed mechanical signal causes the sensing components 32 to undergo limited displacement(s) with respect to the fixed silicon support wall and frame 31 thus proportionally modifying either the stress level in at least one suspension system 33 or the separation gap 50 between at least one sensing element 32 and the encasing member 20. Using a transducing principle, for instance a piezoresistive effect or capacitance changes, the sensor 10 provides an electrical output signal proportional to the impressed mechanical input. The Assembly-related strains and stress and the associated temperature-induced variations negatively affect the proportionality between the electrical output signal and the impressed mechanical input, however.

The assembly-related strains and stress and the associated temperature-induced variations transmitted to the sensing component are reduced by using the principles of the invention.

In the substrate wafer 30 at least one pedestal member 40 is structured by a combination of anisotropic wet and dry etching steps, as follows by way of example in the preferred fabrication process.

A. Into the boron doped substrate wafer 30, the lateral geometry of at least one pedestal member 40, of at least one seismic mass 32 and of the fixed silicon frame 31 is defined by at least one implantation of donor impurities, such as phosphorous. Different doses may be used for the pedestal member, seismic masses and silicon support wall and fixed frame dependent upon the specific sensor's application and design. At least one drive-in process is used to diffuse the donor impurities deep into the silicon wafer until the desired thickness of these structures is achieved. The shape of these structures is defined by the location of the p-n junctions, deep junctions, formed between the n-type-implanted silicon and the p-type substrate. These drive-in steps generate the rounded features illustrated throughout the cross-sectional views shown in FIGS. 1 to 3 and 5 to 8.

B. An n-type epitaxial layer is grown on top of the substrate wafer, with a thickness that depends on the sensor's specific application and design. This epitaxial layer is separated from the p-type substrate by a shallower p-n junction, said shallower junction, apart from several other purposes in the sensor's functionality, provides the entire front surface of the substrate wafer 30 with a continuous n-type material that will be used as an etch stop layer during a subsequent wet etching step. The epitaxial layer also gives the opportunity of structuring the pedestal member 40 and the seismic masses 32 on several layers, as well as providing the material of the suspension system 33.

C. A recess 50, providing separation gap, is etched into the epitaxial layer in order to provide a separation between any movable structures, such as the seismic masses 32 and the suspension systems 33, and the top encasing member 20, thus allowing limited motion of these structures.

D. An anisotropic wet etching step, in combination with an electrochemical etch-stop technique is performed from the back side of the substrate wafer. This is used to selectively remove the p-type material while the n-type material remains unetched. Depending on the crystal orientation of the silicon substrate wafer, on the etching window and its orientation with respect to the silicon crystal and on the anisotropic properties of the etching solution, the lateral walls of the fixed silicon frame 31 are pyramidal in shape. The formed structures are defined by the shape of the deep and shallow junctions, resulting in thicker regions (members) if etch stop occurs on the deep junctions and thinner regions (membranes) if etch stop occurs on the shallow junctions.

E. The final shaping of at least one pedestal member 40, at least one seismic mass 32 component, at least one suspension system 33 and the fixed silicon frame 31 is achieved by dry, reactive ion or plasma etching (or combination thereof) through the said membranes. FIG. 2 shows the structured substrate wafer 30 after this processing step.

F. A suitable bonding technique is used to join and permanently bond the structured substrate wafer 30 with two encasing members 20 and 21, which may also be structured to form a sealed cavity 34. During this fabrication step, the top surface 41 of the pedestal member structure 40 is firmly bonded to the top encasing member 20, completing the assembly process of the sensor element 10 and all its components. If glass wafers are used for encasement, then an anodic bonding technique is suitable; if silicon wafers are used, then silicon-to-silicon bonding techniques are advantageously suited.

In FIG. 2, the pedestal member structure 40 is located inside the dashed rectangle and the cross-hatched areas represent the surface of the structured substrate wafer that is firmly bonded on the top encasing member 20.

Apart from the above mentioned fabrication steps, several other conventional steps such as photolithography, selective growth and etch back of thermal oxides, deposition and patterning of thin metallic films can be used within a generally inexpensive mass production process flow.

The preferred fabrication process described above, including the method of assembly, allows a simultaneous structuring and fabrication of all of the device elements and relies on well known and established micromachining processes.

The examples described hereinafter are based only on two levels of structuring: the thicker regions defined by implantation and drive-in and the thinner regions (structured membranes) patterned in the epitaxial layer. However, in alternative fabrication processes, the members may be realised by several implantations and diffusion processes and the epitaxial layer may be replaced as well by at least one implanted and diffused layer, resulting in several levels of structuring with various thickness for the pedestals members 40, the seismic masses 32, the suspension systems 33 and the fixed silicon frame 31.

In alternative fabrication processes the starting material of the substrate wafer 30 can be of n-type. In this case acceptor impurities are implanted and driven-in to form the pedestal members 40, the seismic masses 32 and the fixed silicon frame 31. Consequently, the epitaxial layer, if used, is also of a p-type silicon and the wet anisotropic etching of silicon is to be combined with an etch stop technique that allows the selective removal of the n-type material of the substrate while not etching the p-type silicon. The photovoltaic etch stop technique or the high boron doping etch stop are advantageous in this particular context.

Figure 4:
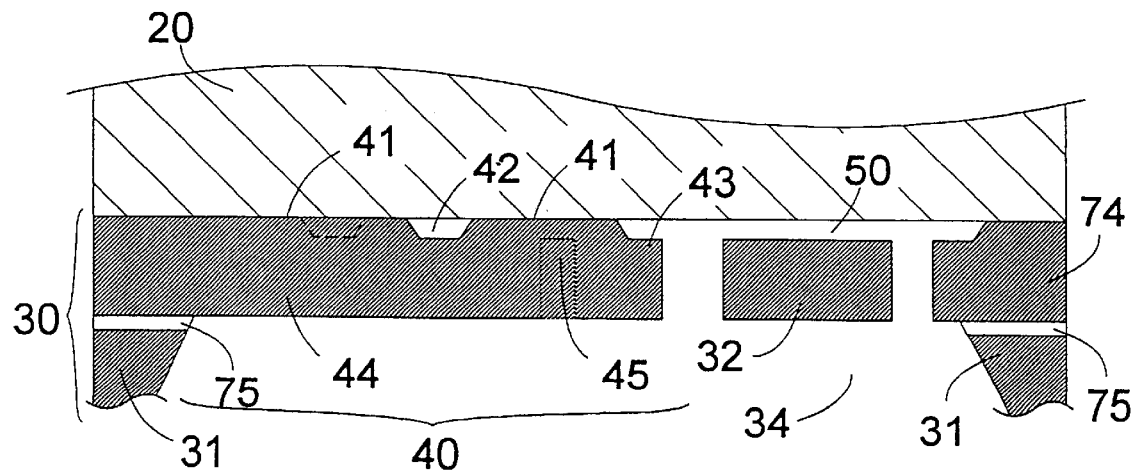
FIG. 4 is a cross-sectional view taken along A—A in FIG. 2, during wafer-based processing of a sensor device recording to the invention.

In alternative fabrication processes the starting substrate wafer 30 can be an SOI wafer of any kind, that is it consists of a single crystal silicon top layer 74 separated from the bulk silicon by a buried, very thin layer of insulating oxide 75. In this case the pedestal member structure is formed by etch stop on the buried oxide layer followed by a deep reactive etching for lateral definition. The separation gap 50 between the movable silicon structures, such as the seismic masses 32 and the suspension systems 33, and the top encasing member 20, is still employed in order to allow a limited motion of these structures. FIG. 4 shows a cross sectional view of the intertial sensor 10 after the last processing step in the SOI wafer-based alternative processing.

With a suitable design for etching window, wet isotropic etching of a silicon in combination with a suitable etch stop technique can be used to remove all the excess substrate material.

Figure 3A:
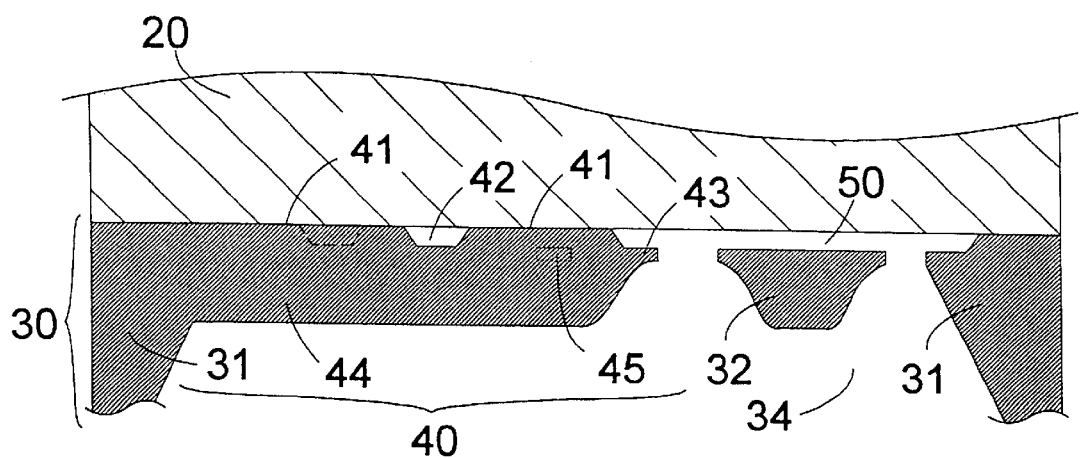
FIGS. 3a and 3b are cross-sectional views taken along lines A—A and B—B respectively in FIG. 2.
Figure 3B:
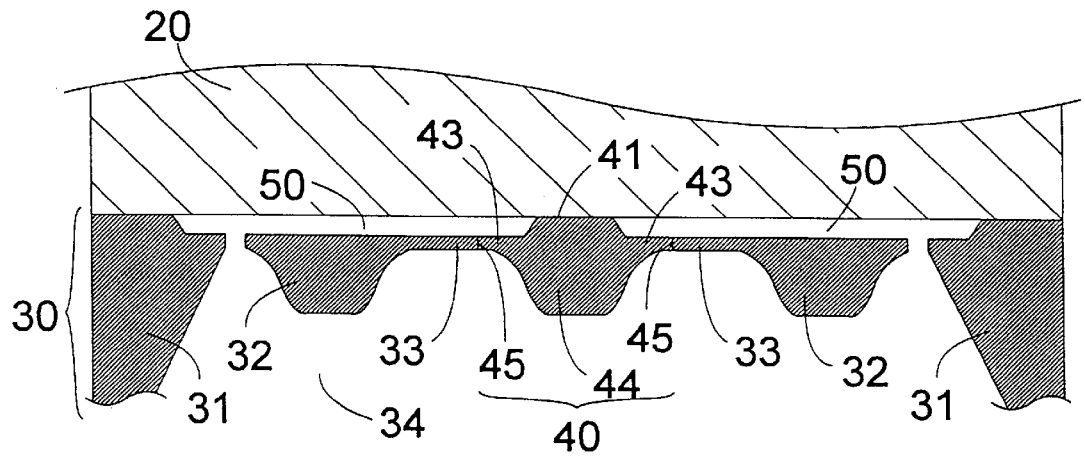

FIG. 2 shows an example device, which is a sensor and its preferred geometry according to the present invention. FIGS. 3*a* and 3*b* show cross-sectional views along lines A—A and B—B of FIG. 2.

The pedestal member structure 40 has an elongate shape consisting of a longer dimension (pedestal length) and a smaller dimension (pedestal width) where the pedestal length and width are mutually a perpendicular. The pedestal structure comprises a thick portion 44 and associated bonded surface 41 or bonded top area. A thinner rim 43 (pedestal rim) and any number of transversal shallow recesses 42 (direct crossing). The thick portion 44 is formed by selective removal of the substrate material with an etch stop on said deep p-n junctions. The pedestal rim 43 is formed by selective removal of the substrate material with an etch stop on shallow p-n junctions. The direct crossings 42 are produced by shallow wet or dry etching of either the said pedestal member structure 40 or the encasing member 20, or both.

One end of the pedestal member structure is attached along its width to a wall of fixed silicon frame 31 while the other end, a pedestal tip, is free as indicated in FIG. 3*a*.

In order to minimise the longitudinal strains and stress(es) that may originate in the fixed frame, the suspension systems 33 that flexibly connect the seismic masses 32 to the pedestal member 40 are attached as far as possible from the edges of the wall of fixed silicon frame 31, that is close to the pedestal tip, in attachments of said hinge 45. The attachments of hinges 45 are indicated in FIG. 3*a* with dotted line, indicating the fact that they are not crossed by the sectioning line.

Except for the attachment to the fixed silicon frame, the bonded top area 41 and the attachments of hinges 45, all the remaining pedestal surfaces are free and, therefore, no strains or stress can develop along them.

In order to reduce further on the transmitted strain and stress, the suspension system can be attached directly to the pedestal rim 43 and as far as possible from the thick portion 44 and bonded top area 41, resulting an overall T-shaped pedestal, as indicated in FIG. 2. FIG. 3*b* shows a transversal cross-section through the inertial sensor 10, showing the pedestal member structure 40 and indicating the recommended location of the attachments of hinges 45.

The length of the pedestal member and the width of the pedestal rim in the regions of the attachments of hinges are preferably as large as possible, their size being limited only by the available space within the sensor die. At the same time, the bonded top area 41 should be minimised in order to reduce the stress developed due to possible material mismatch between the substrate wafer 30 and the encasing member 20. However, in order to achieve a rigid and strong bonding, the bonded top area 41 must not be reduced below certain limits that depend mainly on the chosen bonding technique.

Figure 5:
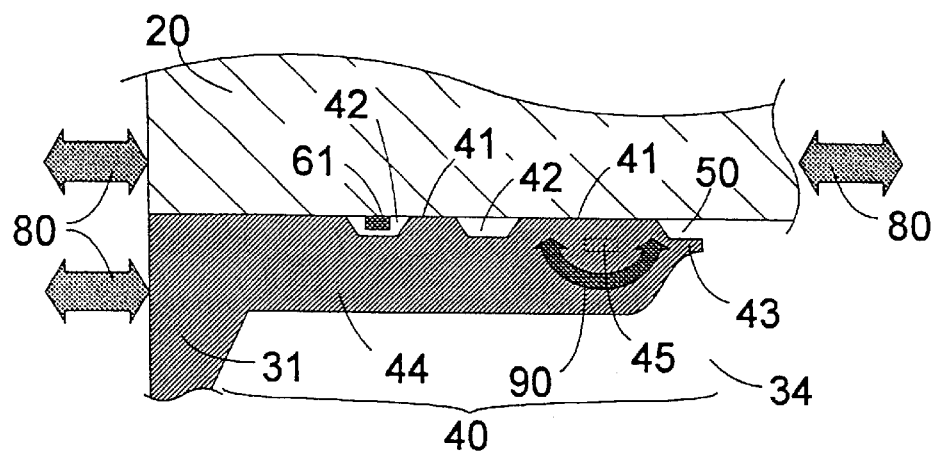
FIG. 5 is a longitudinal cross-sectional view of a pedestal member structure and the mechanical loads generated by the packaging and/or temperature variations, in an example of the invention.

In the preferred embodiment, as indicated in FIG. 5, only longitudinal mechanical loads can generate strain and stress in the attachments of hinges 45 and through the suspension system 33 further on into the device component 32. However, owing to the pedestal geometry and method of assembly according to the present invention, the transmitted loads are several orders of magnitude smaller than the loads exerted on the silicon fixed frame 31.

The mechanical strains and stress through the pedestal member structure 40 decrease from the wall of the silicon fixed frame 31 towards the pedestal tip and from the bonded top area 41 towards the sides and underneath free surfaces of the pedestal member. With the suspension systems attached as indicated in FIGS. 2, 3*a* and 3*b*, the transmitted loads to the suspension systems 33 are torques which generate a negligible rotation around the attachments of hinges 45. If the suspension systems 33 are attached exactly at the pedestal tip, along the pedestal length, the transmitted load 90 is a bending momentum.

The direct crossing 42 provide an advantageous way of reducing the bonded top area 41 between the pedestal member 40 and the encasing member 20, thus minimising the transmitted load 90, while preserving a required width which allows a strong and rigid bonding.

In FIGS. 6*a* to 6*d* several designs for the device are shown in transversal cross-sectional view and in analogy with the examples shown in FIGS. 1, 2, 3*a*, 3*b* and 5.

Figure 6A:
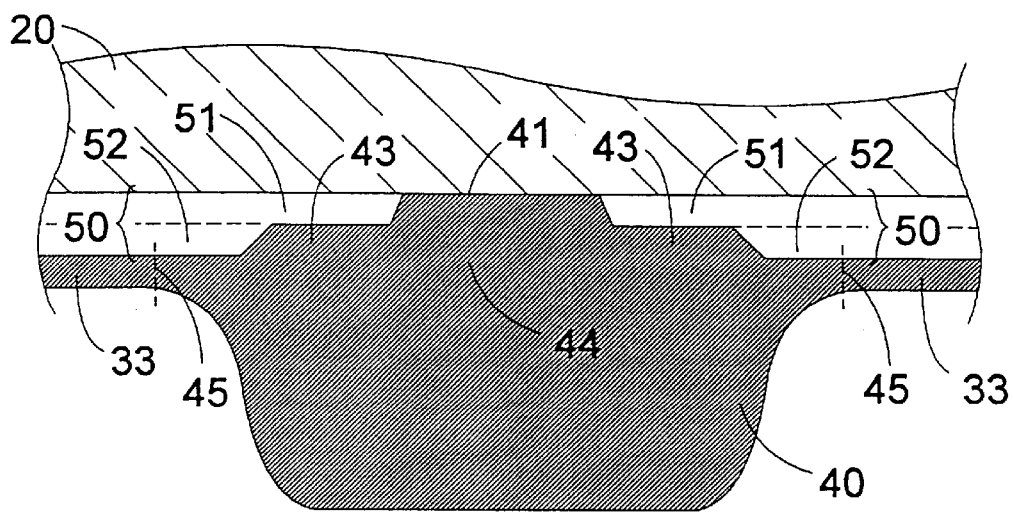
FIGS. 6a, 6b, 6c and 6d are transverse cross-sectional views of a pedestal member showing various options for structuring.

FIG. 6*a* shows a transversal cross-sectional view through a basic example pedestal member structure 40, wherein the separation gap 50 is achieved in two distinctive steps: a primary or recess 51 is structured by etching the silicon, either wet or dry, along the pedestal rim 43, and a secondary (optional) recess 52 is structured by etching the silicon, either wet or dry above the suspension systems 33 and/or seismic masses 32. The dashed line in FIG. 6*a* represents the surface of the substrate wafer 30 if the optional recess 52 is omitted.

Generally, the pedestal member structure 40 is electrically conductive, therefore electrically non-conductive layers, such as thermal oxides or regions, such as p-n junctions, must be employed whenever several electrically conductive paths are to be isolated from each other and/or from the pedestal bulk material.

Figure 6B:
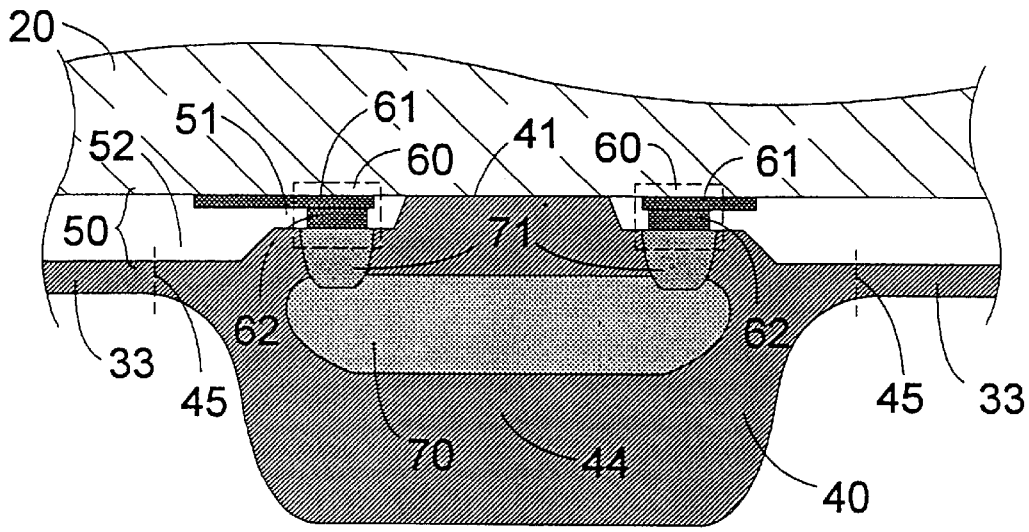
Figure 6C:
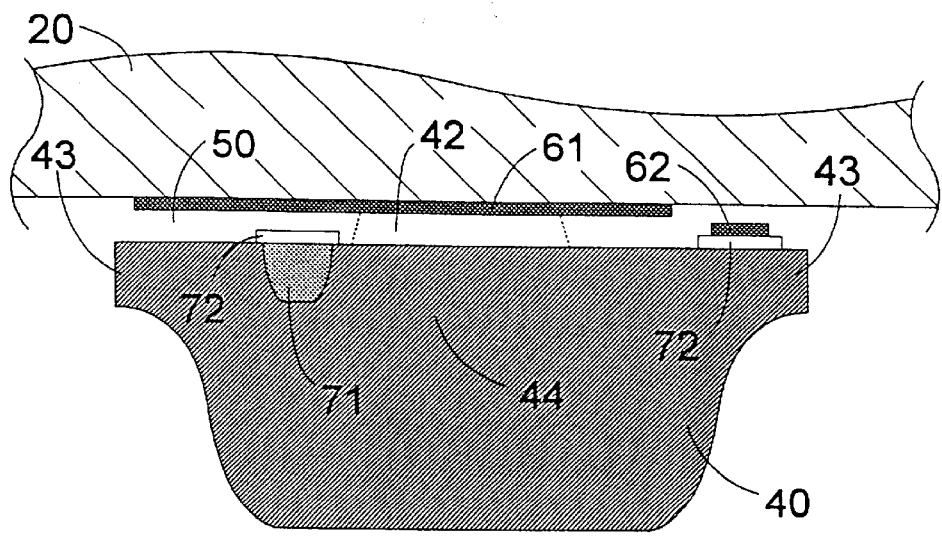
Figure 6D:
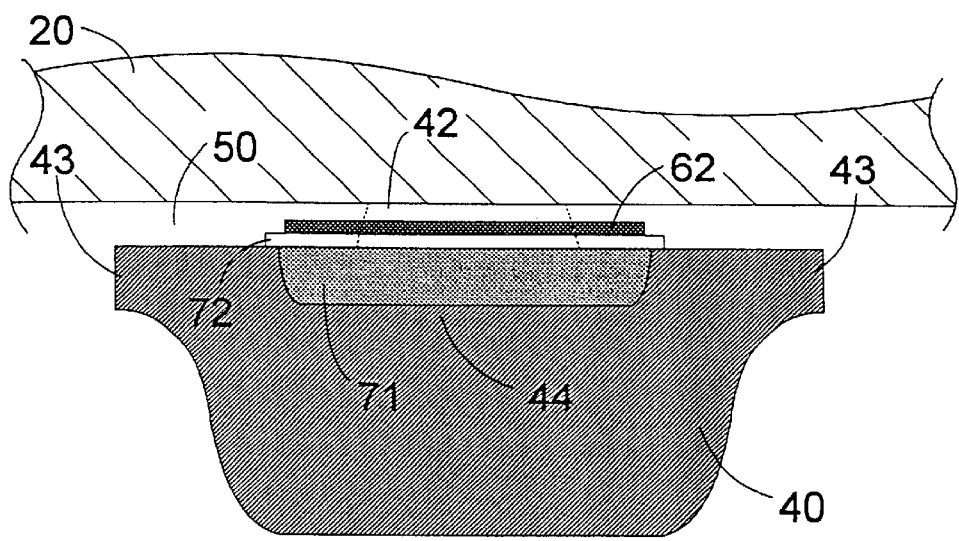

FIGS. 6*b*, 6*c* and 6*d* show further optional features that can be implemented along with the basic pedestal member structure, depicted in FIG. 6*a*.

The present invention allows the implementation of direct electrical contacts between a patterned metal film 61 located on the encasing member 20 and a patterned metal film 62 located on the substrate wafer 30, by pressing and squeezing them into each other during the wafer bonding step, resulting in an electrical contact (press-contact) 60. The press-contacts 60 allow the direct transfer of electric signals from conductive paths located on the encasing member 20 to conductive paths located on the substrate wafer 30, a feature of importance in the design of micromachined sensors. At least one of the two metallic films 61 and 62 employed within a press contact 60 should be a soft metal that deforms and flows easily under pressure. In addition, the total area of each of the said press-contacts 60 should preferably remain small in order to allow for lateral flow of the soft metal film and the total thickness of the two metallic films 61 and 62 employed within a press-contact should be slightly larger than the said film recess 51, but not excessively larger in order not to hinder the bonding process between the pedestal member 40 and the encasing member 20 occurring nearby.

FIG. 6*b* shows an example of press-contacts 60 in accordance with the present invention.

The present invention also allows the implementation of buried conductive paths (buried crossings) transversally through the thick portion 44. The buried crossings are fabricated by a patterned implantation of a p-type impurity inside the thick portion 44 and a subsequent drive-in to the desired depth, such that a p-n junction forms between the implanted area and the underlying n-type thick portion 44, followed by the epitaxial growth which buries the p-type conductor (buried conductor) 70. Additionally, p-type impurities are implanted in at least two isolated islands and subsequently driven-in, resulting in surface conductors 71, where surface conductors 71 are driven-in long enough to contact the buried conductor 70, such that a transversal, continuous and buried electrical path between at least two press-contacts 60 is formed.

FIG. 6*b* shows an example of buried crossings in accordance with the present invention.

Surface conductors 71 can be used to carry isolated electrical signals along the pedestal rim 43, where the separation gap 50 or recess rim 51 is used to prevent the bonding between the areas in which the surface conductors 71 are located and the encasing member 20 and where an-oxide layer 72 is used to passivate the p-n junctions that separate the said surface conductors 71 from the n-type material of the pedestal member 40.

Metal conductors 62 can be used to carry isolated electrical signals along pedestal rim 43, where an oxide layer 72 is used to electrically isolate the metal conductors 62 from the pedestal member 40 and where the separation gap 50 of recess rim 51 is used to prevent the bonding between the metal conductor 62 and the covering wafer 20.

The present invention allows the implementation above and across the thick portion 44 of direct conductive paths within the said direct crossings 42, wherein a patterned metal film 61 located on the encasing member 20 is the conductive element which is electrically isolated from the thick portion 44 by the separation gap 50 or recess rim 51.

FIG. 6*c* shows surface conductors and metal conductors either along the pedestal rim 43 or across the thick portion 44 in accordance with the present invention.

The lateral walls of the thick portion 44, adjacent to the said direct crossings 42, are shown with dotted lines, indicating the fact that they are not crossed by the sectioning line.

The present invention allows the implementation above and across the thick portion 44 of direct conductive paths within the said crossings 42, wherein a patterned metal film 62 located on the thick portion 44 is the conductive element which is electrically isolated from the thick portion 44 by means of an oxide layer 72 and from the encasing member 20 by the separation gap 50 or recess rim 51.

The present invention allows the implementation above and across the pedestal member 40 of direct conductive paths within the direct crossings 42, wherein a patterned surface conductor 71 located within the pedestal member 40 is the conductive element which is electrically isolated from the pedestal member 40 by means of a p-n junction and has its surface passivated by an oxide layer 72. This in turn is separated from the encasing member 20 by the separation gap 50 or recess rim 51.

FIG. 6*d* shows examples of the surface conductors and metal conductors across the pedestal member 40 in accordance with the present invention. The lateral walls of the pedestal member 40, adjacent to the said direct crossings 42, are shown with dotted lines, indicating the fact that they are not crossed by the sectioning line.

Side views of the said direct crossings 42, with a direct conductive path realised as patterned metal film 61 or without are shown in FIGS. 3a and 5.

In alternative fabrication processes the pedestal material can be of a p-type. Consequently, the epitaxial layer, if used, is also of a p-type silicon. In this case donor impurities are implanted and driven-in to form the said buried conductors 70 and said surface conductors 71.

FIGS. 7*a* to 7*d*, 8*a* and 8*d* to 9 show examples of the invention realised in alternative fabrication processes.

In alternative fabrication processes the separation gap 50 can be realised either totally or partially in the top encasing member 20.

In alternative fabrication processes the pedestal member can have a structured thickness, achieved by using several and different implantation and drive-in steps, depending on the specific device application and design and on the attachment location of the suspension systems.

Figure 7A:
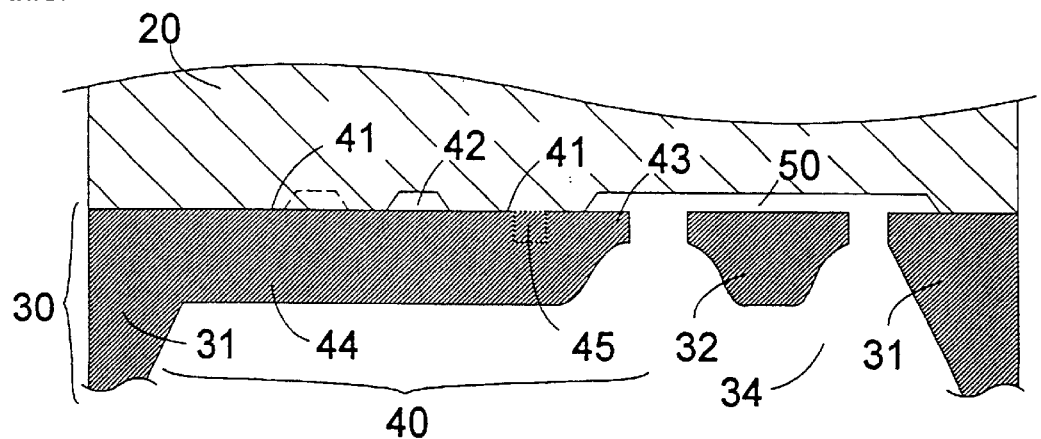
FIGS. 7a, 7b, 7c and 7d are cross-sectional views taken along line A—A in FIG. 2, in alternative examples.
Figure 7B:
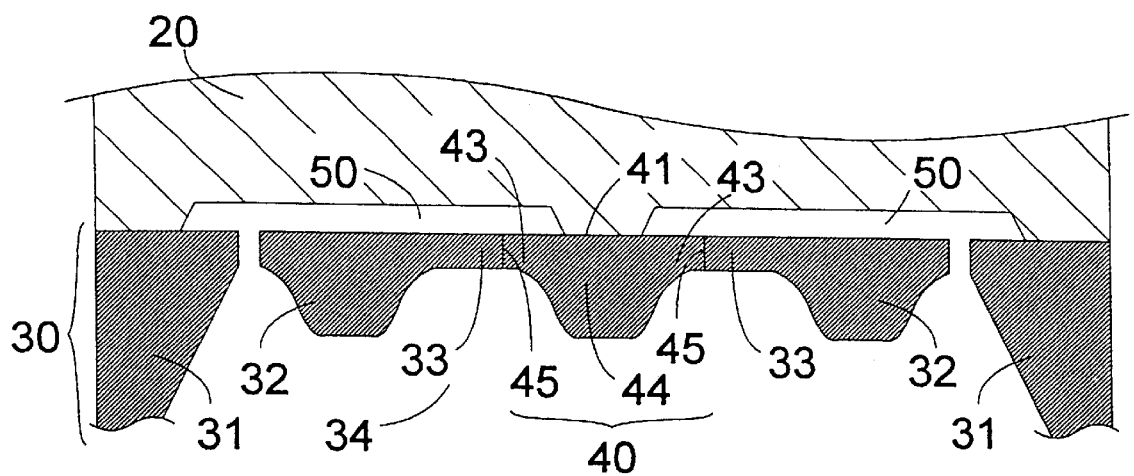

FIGS. 7*a* and 7*b* show cross-sectional views along lines A—A and B—B of FIG. 2, presenting an alternative pedestal member structure 40 in an alternative fabrication process in which the separation gap 50 is totally realised in the encasing member 20.

Figure 7C:
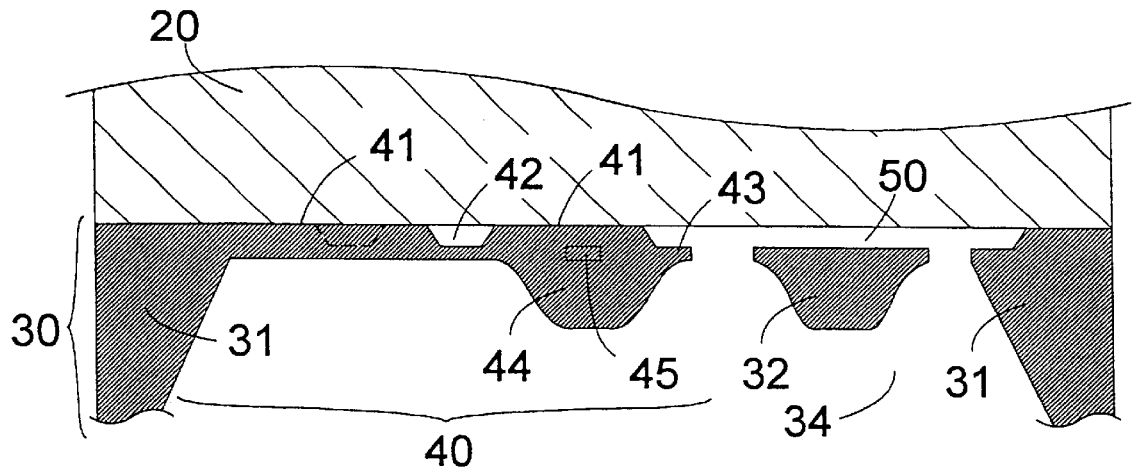

FIG. 7*c* shows a cross-sectional view along line A—A of FIG. 2, presenting an alternative example of the pedestal member structure in an alternative fabrication process in which the pedestal member 40 has a structured thickness and the separation gap 50 is totally realized within the substrate wafer 30.

Figure 7D:
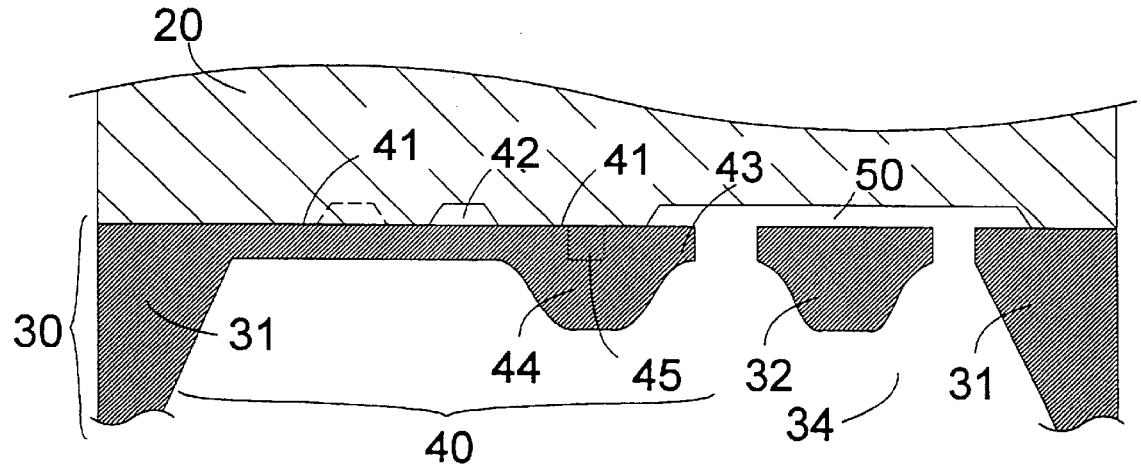

FIG. 7d shows a cross-sectional view along line A—A of FIG. 2, presenting an alternative example of the pedestal member structure in the alternative fabrication process in which the pedestal member 40 has a structured thickness and the separation gap 50 is totally realised in the top covering wafer 20.

Figure 8A:
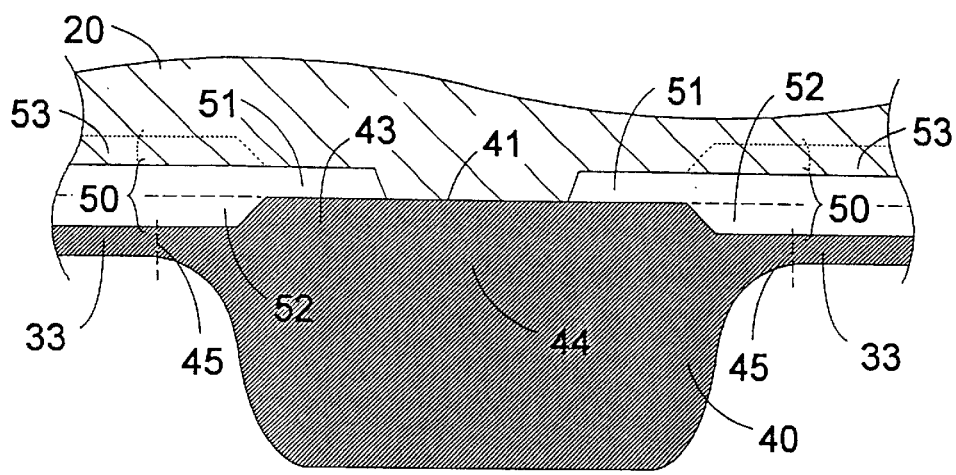
FIGS. 8a, 8b, 8c and 8d are transverse cross-sectional views of the pedestal member structure showing various options of structuring, in alternative examples.

FIG. 8a shows a cross-sectional view along line B—B of FIG. 2, presenting alternative examples of the pedestal member structure in the alternative fabrication process in which the separation gap 50 is partially realised in the top encasing member 20 and partially realised in the substrate wafer 30, wherein the separation gap 50 consists of the rim recess 51 realised in the top encasing member 20 and at least one optional recess realised either within the substrate wafer 30, denoted by reference designation 52, or within the encasing member 20, denoted by reference designation 53.

Figure 8B:
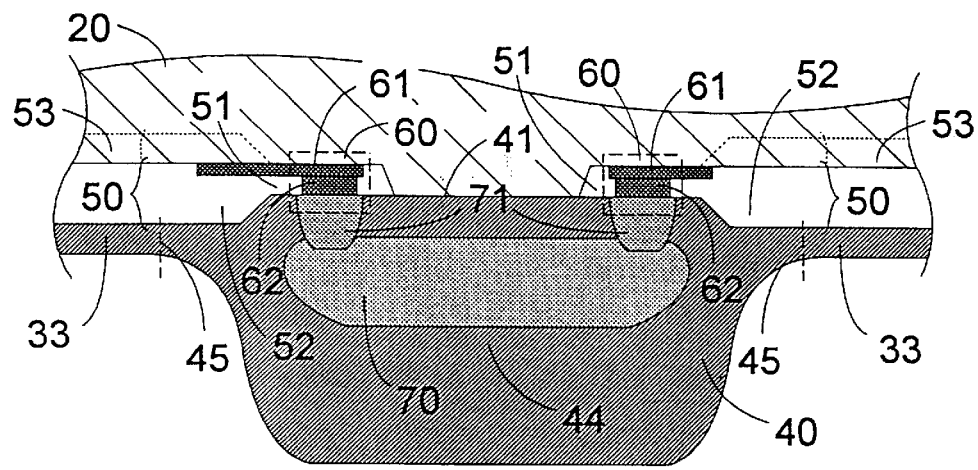

FIG. 8b presents examples of press-contacts 60 and buried crossings in the pedestal member structure of FIG. 8a.

Figure 8C:
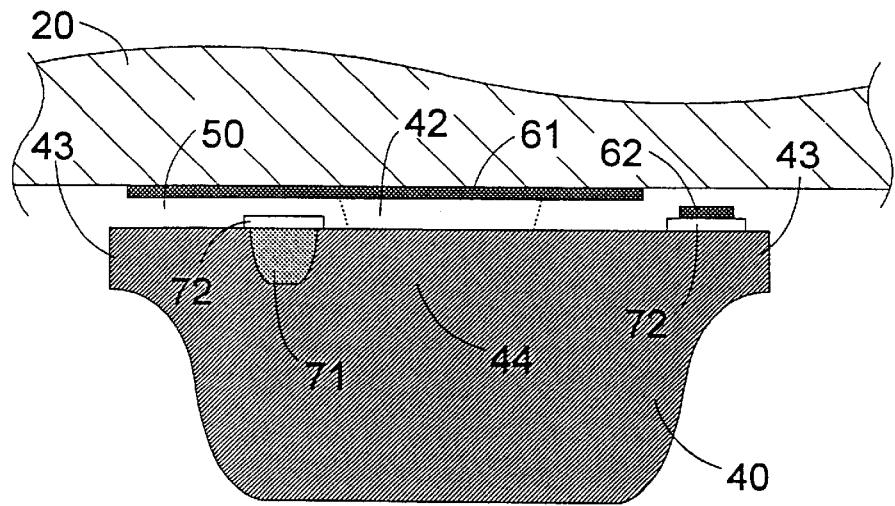
Figure 8D:
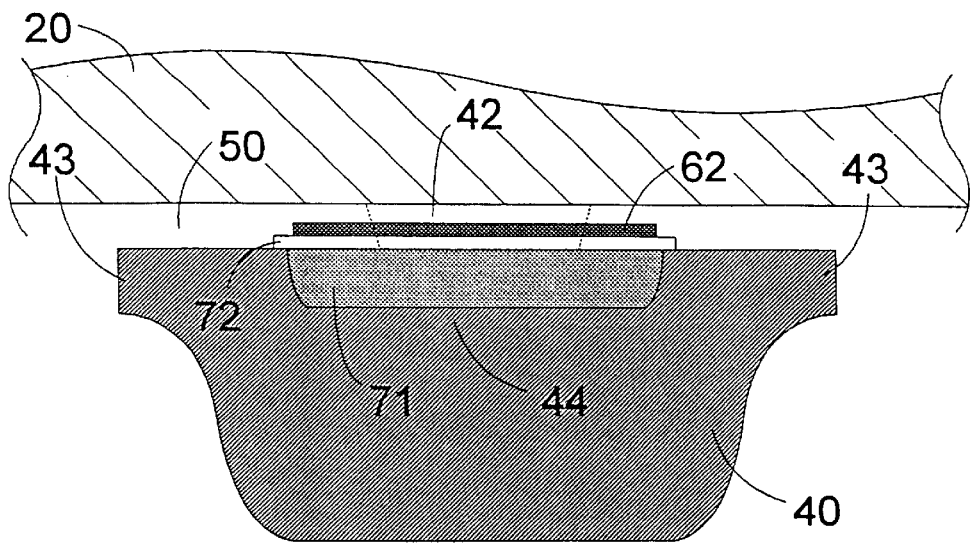

FIGS. 8c and 8d present examples of electrical conductors along the pedestal rim 43 and/or across the pedestal member 40 and the direct crossings 42, in the pedestal structure of FIG. 8a. The lateral walls of the pedestal member 40, adjacent to the direct crossings 42 are shown with dotted lines, indicating the fact that they are not crossed by the sectioning line.

Figure 9:
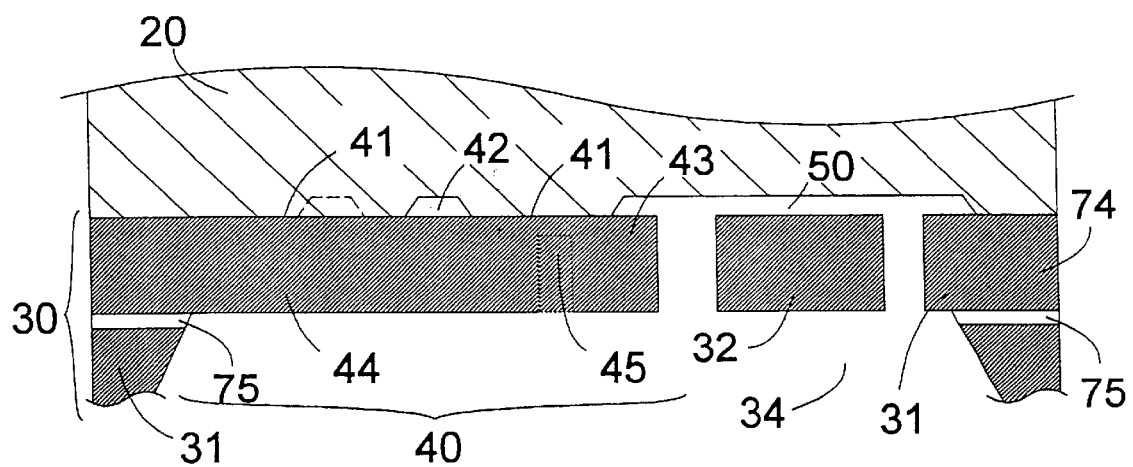
FIG. 9 is a longitudinal cross-sectional view of the pedestal member taken along line A—A in FIG. 2, in alternative examples of SOI wafer-based processing.

FIG. 9 shows a cross-sectional view along line A—A of FIG. 2, presenting an alternative embodiment of the pedestal member structure in an alternative fabrication process in which the substrate wafer 30 is of an SOI type, that is it consists of a single crystal silicon top layer 74 separated from the bulk silicon by a buried, very thin layer of insulating oxide 75. The separation gap 50 is depicted as being realised totally in the encasing member 20, in comparison with the example shown in FIG. 4 where the separation gap 50 is realised totally within the top silicon layer 74.

What is claimed is:

1. A micromechanical device, comprising:
   a semiconductor wafer structured to form a support wall and a pedestal member connected to and extending from the support wall, wherein the pedestal member defines an inner end portion that is connected to the support wall and an outer end portion, spaced from the inner end portion, that is not connected to the support wall;
   a first encasing member located adjacent the semiconductor wafer;
   a second encasing member spaced from the first encasing member and located adjacent the semiconductor wafer;
   wherein the pedestal member is bonded to only the first encasing members and is not bonded to the second encasing member;
   wherein the pedestal member defines an outer periphery and includes a rim formed around at least a portion of the outer periphery, wherein the rim is located on at least the outer end portion of the pedestal member and is spaced from the first and second encasing members; and
   at least one sensing component supported by the rim of the pedestal member, wherein the sensing component is interconnected with the rim of the pedestal member toward the outer end portion of the pedestal member.

2. A device according to claim 1, wherein the at least one sensing component is supported solely by the rim of the pedestal member.

3. A device according to claim 2, wherein the pedestal member is elongate, and defines an axial dimension extending in a direction substantially perpendicular to the support wall.

4. A device according to claim 3, wherein the support wall is arranged such that the support wall surrounds both the pedestal member and the sensing component of the device.

5. A device according to claim 3, wherein the pedestal member is attached to the first encasing member in a discontinuous manner.

6. A device according to claim 3, wherein the sensing component is connected to the rim by one or more planar flexible hinges.

7. A device according to claim 3, configured as an inertial sensor.

8. A device according to claim 6, wherein there is a gap that separates the first encasing member from the sensing component, the planar hinge and the rim of the pedestal member.

9. A device according to claim 8, wherein the gap is formed by etched recesses either in the semiconductor wafer, or in the first encasing member, or in both.

10. A device according to claim 3, in which direct electrical contacts are provided between patterned metallic films located on the rim of the pedestal member and on a contact surface defined by the first encasing member.

11. A device according to claim 3, wherein electrical conductors are provided by local implantation and drive-in of impurities into the pedestal member, characterized by the fact that the conductors are isolated from each other.

12. A device according to claim 3, wherein electrical conductors are provided by deposition and patterning of metallic films onto the rim, characterized by the fact that the conductors are isolated from each other by thermally grown oxides.

13. A device according to claim 3, wherein electrical conductors are provided by local implantation and drive-in of impurities into the pedestal structure, followed by an epitaxial growth, characterized by the fact that the conductors are buried in the pedestal member and isolated from each other.

14. A device according to claim 3, wherein electrical conductors are provided by deposition and patterning of metallic films onto the first encasing member characterized by the fact that the conductors are isolated from the pedestal member by a separation gap.

15. A micromechanical device, comprising:
   a semiconductor wafer structured to form a support wall and a pedestal member, wherein the support wall defines a boundary of a space, and wherein the pedestal member defines an inner area connected to the support wall and an outer area located outwardly of the support wall that extends into the space, wherein the outer area of the pedestal member is not interconnected with the support wall;
   a first encasing member located adjacent the semiconductor wafer;
   a second encasing member spaced from the first encasing member and located adjacent the semiconductor wafer;
   wherein the pedestal member is bonded to only the first encasing members and is not bonded to the second encasing member; and
   a sensing component interconnected with and supported by the outer area of the pedestal member, wherein the sensing component is arranged so as to be spaced from the first and second encasing members.

16. The micromechanical device of claim 15, wherein the sensing component is solely supported by the outer area of the pedestal member.

17. The micromechanical device of claim 15, wherein the first encasing member defines a contact surface.

18. The micromechanical device of claim 17, wherein the contact surface is coplanar with the surface of the first encasing member to which the pedestal member is bonded, and wherein the sensing component is interconnected with and supported by rim structure defined by the pedestal member that is spaced from the contact surface so as to space the sensing component from the contact surface.

* * * * *